United States Patent
Lipp et al.

(10) Patent No.: US 9,529,038 B2
(45) Date of Patent: Dec. 27, 2016

(54) ELECTRONIC CONTROL CIRCUIT COMPRISING POWER TRANSISTORS AND METHOD FOR MONITORING THE SERVICE LIFE OF THE POWER TRANSISTORS

(75) Inventors: Helmut Lipp, Dörzbach-Hohebach (DE); Günter Haas, Mulfingen (DE); Martin Bürkert, Dörzbach-Hohebach (DE)

(73) Assignee: ebm-papst Mulfingen GmbH & Co. KG, Mulfingen (DE)

( * ) Notice: Subject to any disclaimer, the term of this patent is extended or adjusted under 35 U.S.C. 154(b) by 240 days.

(21) Appl. No.: 14/352,582

(22) PCT Filed: Nov. 21, 2011

(86) PCT No.: PCT/EP2011/070594
§ 371 (c)(1),
(2), (4) Date: Apr. 17, 2014

(87) PCT Pub. No.: WO2013/075733
PCT Pub. Date: May 30, 2013

(65) Prior Publication Data
US 2014/0253170 A1    Sep. 11, 2014

(51) Int. Cl.
*G01R 31/26* (2014.01)
*G01R 31/28* (2006.01)
(Continued)

(52) U.S. Cl.
CPC ......... *G01R 31/282* (2013.01); *G01R 31/2642* (2013.01); *G01R 31/42* (2013.01); *H02M 7/53875* (2013.01)

(58) Field of Classification Search
CPC .... G01R 31/282; G01R 31/42; G01R 31/2642
(Continued)

(56) References Cited

U.S. PATENT DOCUMENTS 4,571,501 A * 2/1986 Crosby ................. H03K 3/286
                                                327/484
5,596,466 A   1/1997 Ochi
(Continued)

FOREIGN PATENT DOCUMENTS

DE        19600807 A1    8/1996
DE        19851186 A1    5/2000
(Continued)

OTHER PUBLICATIONS

International Search Report and Written Opinion of the ISA for PCT/EP2011/070594, ISA/EP, Rijswijk, NL, mailed Mar. 16, 2012.

*Primary Examiner* — Tung X Nguyen
*Assistant Examiner* — Dominic Hawkins
(74) *Attorney, Agent, or Firm* — Harness, Dickey & Pierce, P.L.C.

(57) ABSTRACT

An electronic control circuit for an electronically commutated motor (ECM) is disclosed. A plurality of power transistors controls the ECM, and a reference transistor is formed together with the power transistors on a common support. A control unit is configured to, in a test mode: apply a test current to the reference transistor and one of the power transistors respectively; measure a saturation voltage of the reference transistor and one of the power transistors; evaluate a saturation voltage difference between the measured saturation voltages of the reference transistor and the respective power transistor; evaluate a rate of change of saturation voltage differences between a first iteration of the test mode and a second iteration of the test mode; and determine an expected remaining service life of the power transistors based on the temperature of the support during the test mode and the rate of change of the saturation voltage differences.

17 Claims, 3 Drawing Sheets

Figure 1:
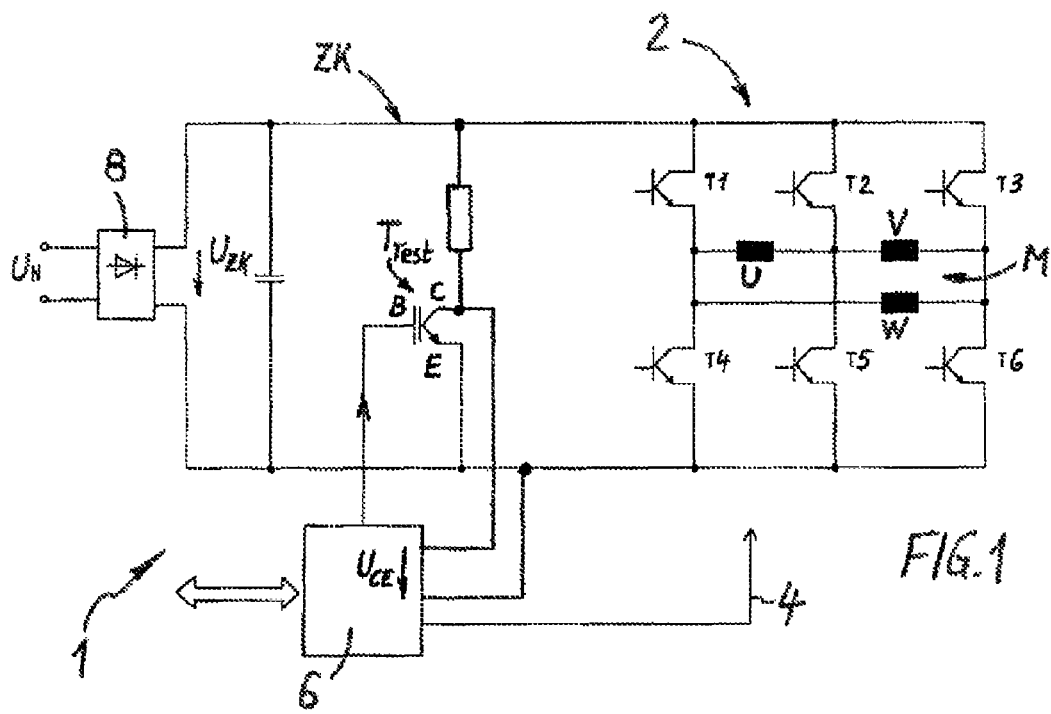

(51) Int. Cl.
*G01R 31/42* (2006.01)
*H02M 7/5387* (2007.01)

(58) Field of Classification Search
USPC .......... 324/762.08, 762.09, 762.01; 702/117
See application file for complete search history.

(56) References Cited

U.S. PATENT DOCUMENTS

| | | | | |
|---|---|---|---|---|
| 5,841,312 A | * | 11/1998 | Mindl | ................ H03K 17/0826 |
| | | | | 323/285 |
| 5,877,419 A | | 3/1999 | Farokhzad | |
| 2003/0179034 A1 | * | 9/2003 | Melis | ................ B60L 11/1805 |
| | | | | 327/427 |
| 2005/0071090 A1 | * | 3/2005 | Katou | ..................... H02M 7/48 |
| | | | | 702/34 |
| 2006/0267621 A1 | * | 11/2006 | Harris | ................ G01R 31/2884 |
| | | | | 324/762.02 |
| 2007/0205732 A1 | * | 9/2007 | Beifus | ....................... H02P 6/34 |
| | | | | 318/432 |
| 2008/0186049 A1 | * | 8/2008 | Valentian | ........... G01R 31/2642 |
| | | | | 326/16 |
| 2010/0246235 A1 | * | 9/2010 | Gouin | .................... G11C 11/417 |
| | | | | 365/72 |
| 2012/0074980 A1 | * | 3/2012 | Choi | ....................... H01L 22/34 |
| | | | | 324/762.01 |
| 2013/0003429 A1 | * | 1/2013 | Murahashi | ............ B60L 3/0046 |
| | | | | 363/56.01 |

FOREIGN PATENT DOCUMENTS

| | | |
|---|---|---|
| DE | 10351843 A1 | 6/2005 |
| DE | 102010000875 A1 | 7/2011 |
| EP | 0795756 A2 | 9/1997 |

* cited by examiner

ELECTRONIC CONTROL CIRCUIT COMPRISING POWER TRANSISTORS AND METHOD FOR MONITORING THE SERVICE LIFE OF THE POWER TRANSISTORS

CROSS-REFERENCE TO RELATED APPLICATIONS

This application is a 371 U.S. National Stage of International Application No. PCT/EP2011/070594, filed Nov. 21, 2011, the entire disclosure of which is incorporated herein by reference.

FIELD

The present invention relates to an electronic control circuit for an electric device, in particular designed as a commutation electronic system of an EC motor, having a plurality of power transistors, which are controlled in an operating mode for controlling the device.

Furthermore, the invention also relates to a novel method for monitoring the power transistors in said type of electronic control circuit with respect to the service life thereof.

BACKGROUND

Electronic control circuits are known in many designs. In the case of the preferred configuration, as the commutation electronic device of an EC motor, i.e. a brushless, electronically commutated electric motor, four or six power transistors are connected to a bridged power amplifier as a rule, the power amplifier being supplied from a DC voltage intermediate circuit. The individual power transistors are controlled by a control unit such that the motor windings are controlled in a manner dependent on the rotational position of a rotor in such a way that a rotating magnetic field to rotate the rotor is created. In this respect the power amplifier practically acts as an inverter, it also being possible for PWM clocking to take place for speed adjustment.

Control circuits are also known generally as inverters or frequency converters for other uses.

The power transistors can either be arranged as discrete components on a support, e.g. a circuit board, or integrated into a module on a common substrate. Moreover, they can be arranged on a heatsink and be designed as bipolar transistors, IGBT's or MOSFET's, for example.

Theoretically, semiconductor elements are not subject to any restriction of service life. In practice, however, ageing processes and total failures of power transistors do occur, i.e. semiconductor components have a finite service life in practical use from experience.

SUMMARY

The object of the present invention is therefore to provide a means by which the ageing process of power transistors can be monitored and an imminent end to the service life can be determined and indicated.

In accordance with the invention, this is achieved in the case of a control circuit by means of an additional, similar, reference transistor which is non-charged in the operating mode of the power transistors and is arranged or formed together with the power transistors on a common support or substrate as well as using means to supply the reference transistor and at least one of the power transistors in a test mode each with a test current and to measure the saturation voltage for each as well as to evaluate a saturation voltage difference resulting from the measured saturation voltages of the reference transistor and the respective power transistor taking into account the prevailing support/substrate temperature during the measurement as a criterion for the ageing process and an anticipated remaining service life of the power transistors—with reference to empirical values.

In an advantageous development of the invention, additional means are provided to record and evaluate a rate of change of the saturation voltage differences recorded in the respective consecutive test modes as an additional criterion for the advance of the ageing process. In the process the rate of change per time unit or per load change is taken into account.

A novel method for monitoring power transistors in said type of electronic control circuit with respect to the expected remaining service life thereof, according to which in a test mode of the control circuit the saturation voltage is measured for at least one of the power transistors thereof and compared to the saturation voltage, likewise measured under the same ambient conditions, of an additional, similar, reference transistor which is non-charged in the operating mode of the control circuit and which is provided together with the power transistors on a common support or substrate, a resultant saturation voltage difference being evaluated, taking into account the temperature of the support (e.g. heatsink) or substrate during the measurement as a criterion for the advance of the ageing process and for the expected remaining service life of the power transistors with reference to previously, calculated and stored empirical values based on experience. Preferably, a rate of change in the respective test modes carried out consecutively is also recorded and evaluated as a criterion for the remaining service life.

Additional advantageous embodiments and developments of the invention are included in the following description.

The invention is based on the knowledge that especially the embedding of a semiconductor chip in a housing and the electrical connections of the chip to the actual external component connections are substantial factors affecting the service life. Two principal factors in the process are on the one hand the so-called bonding onto the chip's top surface as well as on the other hand the solder connections of the chip on an electrically conductive "underlay", which can be a lead frame or a Cu-laminated ceramic, for example. These solder connections are subjected to stress by the different thermal expansions of the chip, solder and respective underlay with each load cycle. The faster the temperature rises in the chip during a load cycle, the greater the mechanical stress load in the region of the solder joints and the stronger the effect on the service life of these connections. The repeated stress loads lead to delamination of the semiconductor chip from the underlay, this delamination advancing from the edges of the chip towards the centre on the underneath of the chip. As a result of the increasing delamination, the thermal resistance of the solder connections in particular increases. Therefore, the absolute temperature of the chip continues to increase at an even power dissipation with an increasing number of load cycles. If this temperature exceeds a maximum permissible chip temperature of 150 to 175° C. as a rule, this leads to a destruction of the semiconductor chip. Furthermore, it was realised that the saturation voltage, i.e. the collector-emitter voltage at fully loaded state of the transistor, depends directly on the current and temperature. The higher the chip temperature, the higher the saturation voltage is too.

According to the invention, therefore, in each test phase specifically provided for the purpose—outside of the actual operation of the control circuit—the saturation voltage is measured and compared to an initial value in order to thus record a change occurring over the operational and service life, which is used as a criterion for the ageing process described above and specifically with reference to empirical values, which have been previously calculated empirically and stored in a control unit. Advantageously, the respective current saturation voltage of the reference transistor measured under the same ambient conditions is used as the initial value here. The comparison of the measured values related to the reference component advantageously saves the need for a highly precise temperature recording of the individual components since the saturation voltage is of course temperature-dependent. Advantageously, therefore, a "rough" recording of the temperature is adequate; it is sufficient to simply establish in which temperature range the temperature of the support, e.g. an existing heatsink, or the common substrate lies during the respective measurement. The empirical values stored in the control unit are assigned to specific temperature ranges, because the saturation voltages and the recorded differences are of course temperature-dependent. Thus, the differences turn out differently at low temperatures than at higher temperatures (depending on the temperature coefficients of the component used in relation to its saturation voltage). The empirical service life values are then taken from the stored tables for the respective temperature range with reference to the respective calculated saturation voltage difference and preferably also the respective rate of change per unit of time or per load cycle and taken into account for the evaluation and indication of the expected remaining service life.

Moreover, according to the invention the assumption is that the change in saturation voltage at the power transistors of the control circuit over the service life advances more or less evenly, but the reference transistor remains almost at its initial values due to the significantly reduced or non-existent operational load and can thus be regarded to be in new condition over the service life of the control circuit.

It is therefore sufficient in principle just to take one of a plurality of existing power transistors into account in the measurement and evaluation according to the invention. Preferably, however, all or at least more than one power transistor is included in the testing, the power transistor with the greatest saturation voltage difference and/or the highest rate of change being regarded as decisive for the advance of the ageing process and for the expected remaining service life of the power transistors and thus the whole control circuit, because of course if just one power transistor fails, the whole control circuit fails.

The measured saturation voltages are fed to a microcontroller, for example, for evaluation. The difference measured thus between the measured saturation voltages and their rates of change gives information about the advance of the ageing process of the solder connections between the chip and the underlay, i.e. about the delaminating. Empirical values then identify the directly impending end of service life or the expected remaining service life.

Conditions for the invention are:
The power transistors and the reference transistor must be integrated as a module on a common substrate or as individual components on a common circuit board.
The power transistors and the reference transistor must constantly be subject to the same ambient conditions, for example temperature, vibration and shock loads.

The test mode according to the invention can be carried out, for example, prior to every start of the actual operating mode of the control circuit and/or in pre-determined, regular or even irregular intervals by interrupting the operating mode. The test mode is triggered and carried out each time via a control unit. In addition, the temperature of the whole arrangement is recorded in order to include it in the evaluation, i.e. the respective component, substrate or heatsink temperature is included combinationally in the evaluation process.

FIGURES

Figure 2:
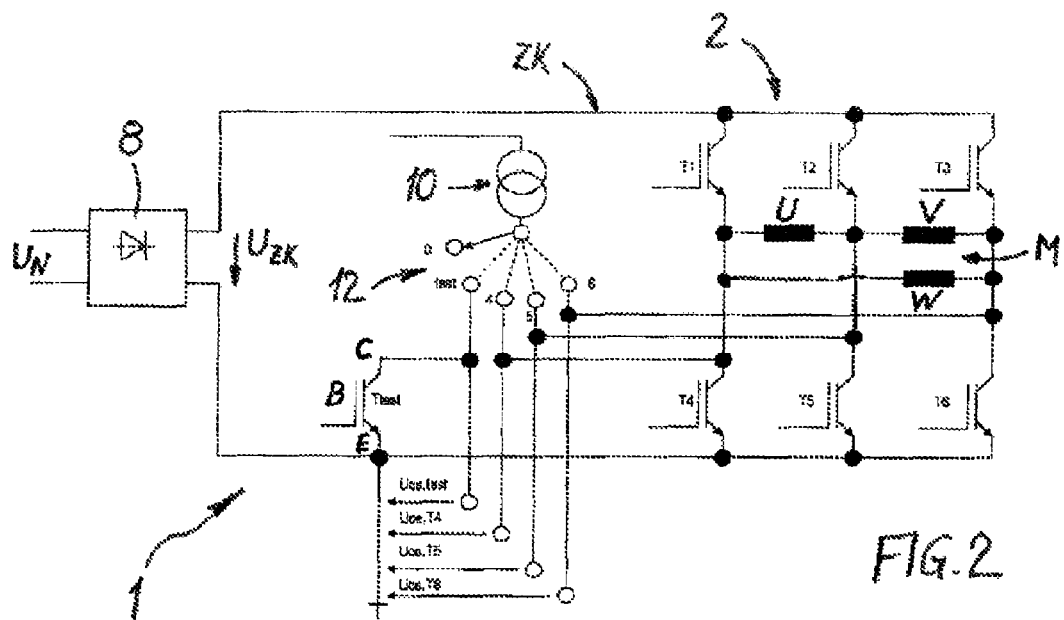
Figure 3:
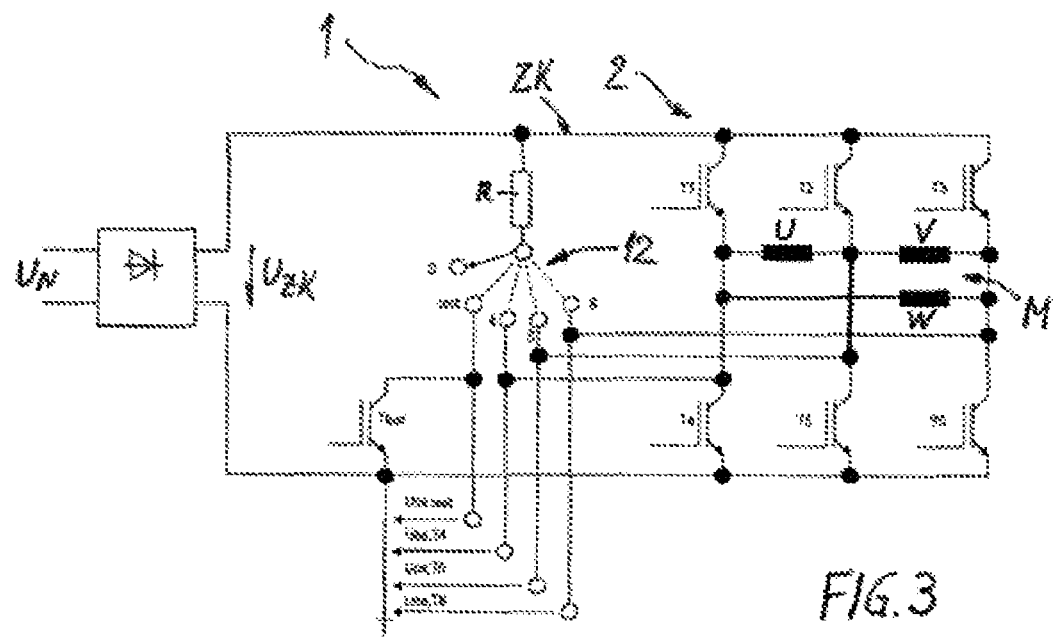
Figure 4:
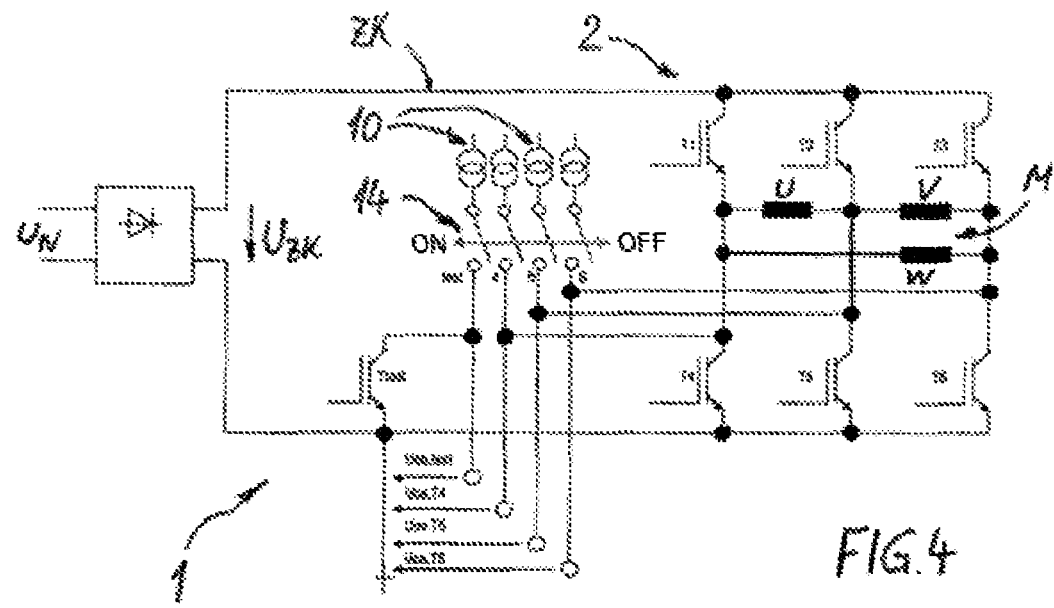
Figure 5:
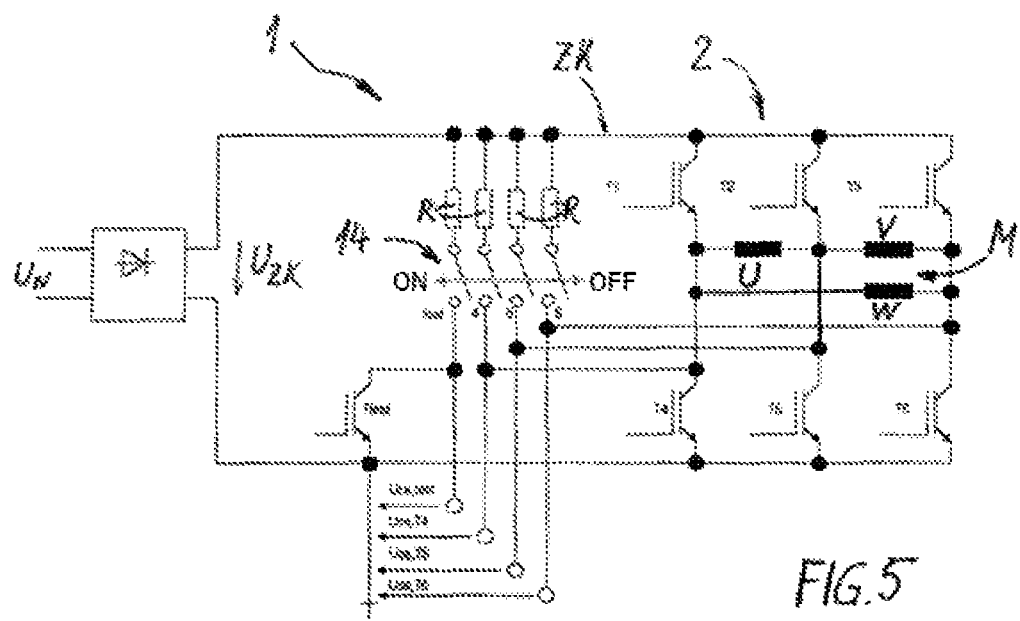

The invention is described in more detail hereinafter using the example of a control circuit for an EC motor and with reference to the drawings, in which:

FIG. 1 shows a circuit diagram of the control circuit with the additional reference transistor according to the invention, FIGS. 2 and 3 show two different variants of circuit diagrams similar to FIG. 1 with measurements of the saturation voltages performed consecutively, and FIGS. 4 and 5 show two different variants of additional circuit diagrams with simultaneous measurement of the saturation voltages.

The same parts are always assigned the same reference numerals in the various figures in the drawings.

DESCRIPTION

With regard to the following description it is expressly emphasised that the invention is not restricted to the embodiments and in the process not to all or more than one feature of described combinations of features, but rather each individual sub-feature of the/each embodiment can also have an inventive significance per se detached from all other sub-features described in conjunction therewith and also in combination with any of the features of another embodiment as well as independently of the combinations of features and back references of the claims.

In the embodiments shown, an electronic control circuit 1 is designed as a commutation electronic system 2 of an EC motor M, it being possible for the motor M to be three-phase with three motor or stator windings U, V, W. In principle, a single-phase design is also possible. Other components of the motor M, such as its rotor, are not shown in the figures.

In the case of the three-phase design, the windings U, V, W can—as is shown by way of example—be wired in a delta connection, but of course alternatively also in a star connection. To control it, six power transistors T1 to T6 are provided here in a bridged power amplifier, two power transistors being located in series in each of three parallel bridge branches and the windings U, V, W each being connected to the bridge branches in between the power transistors. As is only indicated in very simplified form by an arrow 4 in FIG. 1, the power transistors T1 to T6 are controlled for commutation by an electronic control unit 6 in order to create a magnetic rotational field for the rotor. In addition PWM clocking may also take place for adjusting or controlling the motor. This commutation control is generally known and does not require any further explanation here.

The windings U, V, W are normally supplied from a DC voltage intermediate circuit ZK via the power amplifier, it being possible for the intermediate circuit voltage $U_{ZK}$ to be provided from a one or three-phase supply voltage $U_N$ via a rectifier 8. The power amplifier with the power transistors T1 to T6 thus acts as a controlled inverter.

For the sake of completeness, it should be mentioned that for a one-phase motor design one bridge circuit with four power transistors in two bridge branches is adequate.

In accordance with the invention, the control circuit 1—in addition to the power transistors T1 to T6—has an additional, similar power transistor acting as a reference transistor $T_{test}$. This reference transistor $T_{test}$ has no function in a normal operating mode of the control circuit 1 so that it is non-charged and therefore also not subject to any stress-related ageing. However, the reference transistor $T_{test}$ is arranged together with the power transistors T1 to T6 on a common support, e.g. substrate, circuit board and/or heatsink, i.e. it can be integrated into a power module on the same ceramic or as an individual component on the same support. It is thus exposed to the same ambient conditions, such as, in particular, temperature and mechanical influences, as the power transistors T1 to T6.

Furthermore, the control unit 6 is laid out such that in a test mode of the control circuit 1—prior to the actual operating mode or interrupting said operating mode—it controls the reference transistor $T_{test}$ and at least one of the power transistors T1 to T6 and supplies each of them with a test current, in order to measure the respective saturation voltage, and specifically the collector emitter voltage $U_{CE}$ in fully loaded state. By comparing the measured values, a saturation voltage difference is calculated, which—with reference to previously empirically determined empirical values stored in the control unit 6—is evaluated as a criterion for an ageing process and an expected remaining service life of the power transistors T1 to T6. Preferably, the rate of change per unit of time or per load cycle at which the respective saturation voltage differences change is also determined by means of more than one consecutive test phase and the respective rate of change is also included in the evaluation as an additional important criterion for the ageing process.

In the case of the embodiments according to FIGS. 2 to 5, the respective saturation voltage is measured on more than one power transistor and specifically in particular on at least one power transistor of each bridge branch. Preferably, the measurement is carried out on the so-called low side transistors T4, T5, T6 due to the simpler measurability. Thus, the saturation voltages $U_{CET4}$, $U_{CET5}$ and $U_{CET6}$ are measured and compared to the saturation voltage $U_{CEtest}$ of the reference transistor $T_{test}$. If more than one or even all of the existing power transistors are included in the measurement and evaluation, then the power transistor where the greatest saturation voltage difference and/or highest rate of change is detected is definitive for the advance of the ageing process because of course when only one—the "worst"—power transistor fails, the whole control circuit fails.

In the embodiment according to FIG. 2, the respective transistor is connected to a constant current source 10 so it can be supplied with the test current. In this embodiment according to FIG. 2 the measurements are carried out consecutively via a commutator 12.

In the embodiment according to FIG. 3, the respective transistors are connected to the DC voltage intermediate circuit ZK via a resistor R so they can be supplied with the test current, the measurements being carried out consecutively according to FIG. 3 via the commutator 12—as in FIG. 2.

In the other variant according to FIG. 4, all transistors that are to be measured are supplied simultaneously with the respective test current via a multiple switch 14, a separate similar constant current source 10 being provided for each transistor.

Finally, in the embodiment according to FIG. 5 a simultaneous measurement via the multiple switch 14 is also provided, the test current for each transistor being supplied from the intermediate circuit ZK via an identical resistor R.

The embodiments according to FIGS. 4 and 5 concern a parallel multiple measurement with the simultaneous determination of the individual saturation voltages and voltage differences.

The control unit 6 has storage means (not shown) for the tabular entry of certain empirical values of saturation voltage differences and preferably of their rates of change per unit of time or per load cycle, assigning them to the substrate/heatsink temperature during the measurement and to certain stages of an ageing process of the power transistors T1 to T6. Thus, a projection can be made with regard to the stage of the ageing process and thus also with regard to the expected remaining service life with reference to the respective saturation voltage differences determined in the/ each test mode and/or the rate of change determined over more than one test mode and taking into account the respective temperature.

The control circuit according to the invention has expedient means to display the remaining service life and/or to create an optical and/or acoustic warning signal for an impending failure of at least one of the power transistors T1 to T6.

The invention is not limited to the embodiments shown and described but also covers all embodiments acting in the same way in terms of the invention. It is expressly emphasised that the embodiments are not limited to all of the features in combination but rather each individual sub-feature can also have an inventive significance per se even when detached from all of the other sub-features. Furthermore, so far the invention has not been limited to the combinations of features defined in the respective independent claims but rather can be defined by any other combination of certain features or all disclosed individual features. This means that, in principle, practically every individual feature of the respective independent claim can be omitted or replaced by at least one individual feature disclosed in another place of the application. In this respect, the claims are merely to be understood as a first attempt to formulate the invention.

The invention claimed is:

1. An electronic control circuit for an electronically commutated motor (ECM), the electronic control circuit comprising:
   a plurality of power transistors that are controlled in an operating mode to control the ECM;
   a reference transistor that is non-charged in the operating mode of the power transistors and is arranged or formed together with the power transistors on a common support or substrate; and
   a control unit configured to, in a test mode:
      apply a test current to the reference transistor and one of the power transistors respectively,
      measure an associated saturation voltage of the reference transistor and an associated saturation voltage of the one of the power transistors,
      evaluate a saturation voltage difference between the measured saturation voltages of the reference transistor and the respective power transistor,
      evaluate a rate of change of saturation voltage differences between a first iteration of the test mode and a second iteration of the test mode, and
      determine an expected remaining service life of the power transistors based on a temperature of the support during the test mode and the rate of change of the saturation voltage differences.

2. The electronic control circuit according to claim 1, wherein the first and second iterations of the test mode are consecutive.

3. The electronic control circuit according to claim 1, wherein, in order to be supplied with the test current, the one of the power transistors and the reference transistor may be connected to one of a constant current source and a DC voltage intermediate circuit via a resistor.

4. The electronic control circuit according to claim 1, wherein the one of the power transistors and the reference transistor can be supplied individually and consecutively with the test current via a commutator.

5. The electronic control circuit according to claim 1, wherein the one of the power transistors and the reference transistor can be supplied simultaneously with the test current via a multiple switch.

6. The electronic control circuit according to claim 1, wherein the control unit is configured to store empirical values of rate of change of saturation voltage differences corresponding to stages of an aging process of the power transistors.

7. The electronic control circuit according to claim 1, wherein the control unit is configured to display a remaining service life and to generate a warning signal for an impending failure of at least one of the power transistors.

8. The electronic control circuit according to claim 1, wherein at least four power transistors are arranged in series in pairs on respective bridge branches, which are parallel to each other, of a bridge circuit, the saturation voltage being measured in the test mode on at least one power transistor of the pair of power transistors of each bridge branch.

9. A method for monitoring power transistors in an electronic control circuit for an electronically commutated motor (ECM), the method comprising:
  measuring an associated saturation voltage for one of the power transistors and an associated saturation voltage of a reference transistor in a test mode of the electronic control circuit,
  evaluating a saturation voltage difference between the measured saturation voltages of the one of the power transistors and the reference transistor, which is non-charged in an operating mode of the electronic control circuit and is arranged or formed together with the power transistors on a common support or substrate,
  evaluating a rate of change of saturation voltage differences between a first iteration of the test mode and a second iteration of the test mode, and
  determining expected remaining service life of the power transistors based on a temperature of the support during the test mode and the rate of change of the saturation voltage differences.

10. The method according to claim 9, wherein the first and second iterations of the test mode are carried out consecutively.

11. The method according to claim 9, wherein the rate of change of the saturation voltage difference is compared to stored empirical values characterizing an aging process.

12. The method according to claim 9, wherein the method further includes selectively generating a signal for displaying one of (i) the remaining service life and (ii) an impending end to the service life of the one of the power transistors.

13. The method according to claim 9, further comprising:
  before every operation of the electronic control circuit, switching from the operating mode to the test mode; and
  switching from the test mode to the operating mode subsequent to completion of the test mode.

14. The method according to claim 9, wherein saturation voltages of each of the power transistors are measured during the test mode, wherein a rate of change of saturation voltage difference is determined with respect to each of the power transistors, and wherein a highest rate of change of the saturation voltage differences is regarded as definitive for an advance of the aging process and the expected remaining service life of the power transistors.

15. The method according to claim 14, wherein measuring the saturation voltages of the power transistors and of the reference transistor are carried out consecutively or simultaneously.

16. The method according to claim 9, wherein the method further includes supplying a test current to the reference transistor and the one of the power transistors from one of a constant current source and a DC voltage intermediate circuit via a resistor.

17. The method according to claim 13 further comprising, at periodic intervals during the operating mode, switching from the operating mode to the test mode.

* * * * *